United States Patent
Soeno et al.

(10) Patent No.: US 8,248,116 B2
(45) Date of Patent: Aug. 21, 2012

(54) METHOD OF DRIVING REVERSE CONDUCTING SEMICONDUCTOR DEVICE, SEMICONDUCTOR DEVICE AND POWER SUPPLY DEVICE

(75) Inventors: Akitaka Soeno, Toyota (JP); Jun Saito, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 190 days.

(21) Appl. No.: 12/867,591

(22) PCT Filed: Feb. 14, 2009

(86) PCT No.: PCT/JP2009/051690
§ 371 (c)(1),
(2), (4) Date: Aug. 13, 2010

(87) PCT Pub. No.: WO2009/101868
PCT Pub. Date: Aug. 20, 2009

(65) Prior Publication Data
US 2011/0001553 A1    Jan. 6, 2011

(30) Foreign Application Priority Data

Feb. 14, 2008    (JP) ................................. 2008-033003

(51) Int. Cl.
*H03K 3/00* (2006.01)
(52) U.S. Cl. ........ 327/108; 327/110; 327/427; 327/432; 257/577
(58) Field of Classification Search .................. 327/108, 327/110, 112, 427, 432
See application file for complete search history.

(56) References Cited

U.S. PATENT DOCUMENTS

| 7,382,116 | B2  | 6/2008 | Endo et al. |
| 7,498,634 | B2  | 3/2009 | Tsuzuki et al. |
| 7,880,200 | B2* | 2/2011 | Hille et al. ............... 257/197 |
| 8,097,901 | B2* | 1/2012 | Koyama et al. ............ 257/139 |

(Continued)

FOREIGN PATENT DOCUMENTS

EP    2 200 081 A1    6/2010

(Continued)

OTHER PUBLICATIONS

Written Opinion of PCT/JP2009/051690 issued Apr. 28, 2009, and English translation thereof.

*Primary Examiner* — Kenneth B. Wells
(74) *Attorney, Agent, or Firm* — Kenyon & Kenyon LLP

(57) ABSTRACT

A technique for a reverse conducting semiconductor device including an IGBT element domain and a diode element domain that utilize body regions having a mutual impurity concentration, that makes it possible to adjust an injection efficiency of holes or electrons to the diode element domain, is provided. When a return current flows in the reverse conducting semiconductor device that uses an NPNP-type IGBT, a second voltage that is higher than a voltage of an emitter electrode is applied to second trench gate electrodes of the diode element domain. N-type inversion layers are formed in the periphery of the second trench gate electrodes, and the electrons flow therethrough via a first body contact region and a drift region which are of the same n-type. The injection efficiency of the electrons to the return current is increased, and the injection efficiency of the holes is decreased. Due to this, an increase in a reverse recovery current can be prevented, and a switching loss caused in the diode element domain can be decreased.

5 Claims, 8 Drawing Sheets

U.S. PATENT DOCUMENTS 8,120,098 B2 * 2/2012 Arai et al. .................. 257/330

FOREIGN PATENT DOCUMENTS

| | | |
|---|---|---|
| JP | 2000-245137 A | 9/2000 |
| JP | 2003-060208 A | 2/2003 |
| JP | 2006-121863 A | 5/2006 |
| JP | 2006-344779 A | 12/2006 |
| JP | 2007-014059 A | 1/2007 |
| JP | 2007-214541 A | 8/2007 |
| JP | 2007-221922 A | 8/2007 |
| WO | 2009/034851 A1 | 3/2009 |

* cited by examiner

METHOD OF DRIVING REVERSE CONDUCTING SEMICONDUCTOR DEVICE, SEMICONDUCTOR DEVICE AND POWER SUPPLY DEVICE

This is a 371 national phase application of PCT/JP2009/051690 filed 2 Feb. 2009, which claims priority of Japanese Patent Application No. 2008-033003 filed 14 Feb. 2008, the contents of which are incorporated herein by reference.

FIELD OF THE INVENTION

The present invention relates to a method of driving a reverse conducting semiconductor device. The present invention also relates to a semiconductor device provided with the reverse conducting semiconductor device and a controlling circuit for controlling the same. Further, the present invention relates to a method of driving a power supply device composed by a combination of a plurality of reverse conducting semiconductor devices.

BACKGROUND OF THE INVENTION

A reverse conducting semiconductor device having a structure in which an IGBT element domain and a diode element domain coexist within a mutual semiconductor substrate is known. FIG. 1 exemplifies a border portion of a reverse conducting semiconductor device 20 having both an NPNP-type IGBT element domain and a diode element domain. Hereinbelow, the explanation will be given based on an example of the reverse conducting semiconductor device 20 having the NPNP-type IGBT element domain, however, the same applies to a reverse conducting semiconductor device having a reversed conductivity type and a PNPN-type IGBT element domain.

In the IGBT element domain 22 of the reverse conducting semiconductor device 20, a p-type body region 36, an n-type drift region 38 and a p-type collector region 44 are laminated. On a surface of the body region 36, an $n^+$-type emitter region 30 is formed. In a region where the emitter region 30 is formed, a first trench gate electrode 26 penetrating the body region 36 which separates the emitter region 30 and the drift region 38 is formed.

Furthermore, in the diode element domain 24, the p-type body region 36, the n-type drift region 38 and an n-type drift contact region 40 are laminated. The body region 36 and the drift region 38 of the diode element domain 24 are composed by shared regions of the body region 36 and the drift region 38 of the IGBT element domain 22. On the surface of the body region 36, an $n^+$-type first body contact region 35 and a $p^+$-type second body contact region 34 are formed. In a region where the first body contact region 35 is formed, a second trench gate electrode 46 penetrating the body region 36 which separates the first body contact region 35 and the drift region 38 is formed.

In the reverse conducting semiconductor device 20, in a case where a positive voltage is applied to the first trench gate electrode 26 while a positive voltage that is higher than that of the emitter region 30 is being applied to the collector region 44, a current flows from the collector region 44 to the emitter region 30. On the other hand, in a case where a positive voltage that is higher than that of the drift contact region 40 is applied to the second body contact region 34, a current flows from the second body contact region 34 to the drift contact region 40.

If e.g. an inverter circuit is composed by using the reverse conducting semiconductor device, there is no need to separately prepare a semiconductor element that functions as an IGBT and a semiconductor element that functions as a diode.

In the above, the example of the NPNP-type IGBT element domain has been explained. In such a case, the second body contact region 34 and the body region 36 becomes an anode, and the drift region 38 and the drift contact region 40 becomes a cathode. In a case of using the PNPN-type IGBT element, the second body contact region 34 and the body region 36 becomes the cathode, and the drift region 38 and the drift contact region 40 becomes the anode.

The reverse conducting semiconductor device in which the IGBT element domain and the diode element domain coexist within the mutual semiconductor substrate is disclosed in Japanese Patent Application Publication Nos. 2000-245137 and 2003-60208.

SUMMARY OF THE INVENTION

In a case where the IGBT element domain and the diode element domain coexist, it is advantageous to manufacture the body region of the diode element domain, which becomes the anode in the case where the IGBT is of the NPNP type, and which becomes the cathode in the case where the IGBT is of the PNPN type, together with the body region of the IGBT element domain in a mutual process using a mutual condition.

In such a case, an impurity concentration of the body region in many cases is adjusted to the impurity concentration that realizes a property required for the IGBT element domain. That is, the impurity concentration of the body region of the diode element domain in many cases cannot be adjusted to an impurity concentration that would realize a property favorable for the diode element domain. Due to this, in many cases, an injection efficiency of electrons or holes that flow in the diode element domain cannot be adjusted. If the injection efficiency of the holes (hole current/(hole current+electron current)) is too high, then a switching loss in the diode is increased. If the impurity concentration of the body region of the diode element domain can be adjusted freely, it can be adjusted to the injection efficiency of the holes that enables to decrease the switching loss in the diode. However, when the concentration is determined in accordance with the circumstances of the IGBT element domain, it cannot be adjusted to the concentration that is required for achieving the property of the diode element domain.

For example, in the case of the reverse conducting semiconductor device 20 of FIG. 1, there may be a case in which a p-type impurity concentration of the body region 36 required for realizing the property required for the IGBT element domain 22 is higher than the p-type impurity concentration of the body region 36 required for decreasing the switching loss of the diode element domain 24. In such a case, when a return current flows in the diode element domain 24, a large amount of holes flow into the drift region 38 from the body region 36 having the high p-type impurity concentration. That is, the injection efficiency of the holes may become high. As a result, after the return current has stopped flowing in the diode element domain 24, the large amount of holes is stocked in the drift region 38. The holes stocked in the drift region 38 return to the body region 36 from the drift region 38 after the flowing of the return current has ended, and thereby generate a reverse recovery current. When the concentration of the p-type impurity in the body region 36 is larger, the injection efficiency of the holes becomes higher, and a larger return current flows. When such a large return current flows, the switching loss caused in the diode element domain 24 increases. Further, the varying speed of the return current also becomes large, and a large surge voltage is generated. When the surge voltage becomes excessively large, there is a possibility of damaging the reverse conducting semiconductor device 20. Even in the reverse conducting semiconductor device in which the IGBT element domain 22 and the diode element domain 24 use the body regions 36 having the mutual impurity concentration, a technique to adjust the injection efficiency of the holes flowing into the diode element domain is required.

The present invention solves the above problem. That is, the present invention aims to provide a driving method for a reverse conducting semiconductor device having an IGBT element domain and a diode element domain that use body regions having a mutual impurity concentration, the method being capable of adjusting an injection efficiency of holes or electrons into the diode element domain. Further, the present invention aims to provide a semiconductor device provided with a circuit that controls the reverse conducting semiconductor device as such.

The present invention relates to a method for driving a reverse conducting semiconductor device including an IGBT element domain and a diode element domain coexisting in a mutual semiconductor substrate. Especially, the present invention relates to a method for driving the reverse conducting semiconductor device in which the IGBT element domain and the diode element domain use body regions having a mutual impurity concentration.

In the IGBT element domain of the reverse conducting semiconductor device, a second conductive type body region, a first conductive type drift region, and a second conductive type collector region are laminated. A first conductive type emitter region is formed on a surface of the body region. A first trench gate electrode penetrating the body region that separates the emitter region from the drift region is formed in an area where the emitter region is formed.

In the diode element domain of the reverse conducting semiconductor device, a second conductive type body region, a first conductive type drift region and a first conductive type drift contact region are laminated. A first conductive type first body contact region and a second conductive type second body contact region are formed on a surface of the body region. A second trench gate electrode penetrating the body region that separates the first body contact region from the drift region is formed in an area where the first body contact region is formed. In the diode element domain, the body region functions as one of an anode region and a cathode region, and the drift region functions as another region thereof. If the body region is the anode region, then the drift region is the cathode region; if the body region is the cathode region, then the drift region is the anode region.

The body regions of the IGBT element domain and the diode element domain have identical impurity concentration. Similarly, the drift region of the IGBT element domain and the drift region of the diode element domain have identical impurity concentration.

The method for driving the semiconductor device of the present invention applies a first voltage to at least the first trench gate electrode in a case where the IGBT element domain is maintained in an on-state. At this juncture, a voltage may be applied to the second trench gate electrode, or alternatively, may not be applied thereto. Further, a polarity of the voltage to be applied is not limited.

Further, the method of driving the semiconductor device of the present invention applies a second voltage to at least the second trench gate electrode in a case where the return current flows in the diode element domain. At this juncture, a voltage may be applied to the first trench gate electrode, or alternatively, may not be applied thereto. Further, the polarity of the voltage to be applied is not limited.

In the method of driving the semiconductor device of the present invention, when the first voltage is higher than that of the body region, then the second voltage is higher than that of the body region, and when the first voltage is lower than that of the body region, then the second voltage is lower than that of the body region.

In the method for driving the reverse conducting semiconductor device, the first voltage is applied to the first trench gate electrode in the case where the IGBT element domain is maintained in the on-state. In order to have the IGBT element domain enter the on-state, a voltage that forms an inversion layer in the body region and that exceeds a threshold voltage for the IGBT element domain to turn on is applied to the first trench gate electrode. When the body regions is of the p-type, by applying a voltage that is higher than a voltage in which the threshold voltage is added to the voltage of the body region to the first trench gate electrode, the body region adjacent to the first trench gate electrode is inversed to the n-type, and the IBGT element turns on. When the body regions is of the n-type, by applying a voltage that is lower than a voltage in which the threshold voltage is subtracted from the voltage of the body region to the first trench gate electrode, the body region adjacent to the first trench gate electrode is inversed to the p-type, and the IBGT element turns on. The polarity of the first voltage applied to the first trench gate electrode is dependent on the conductivity of the body region. If the body region is of the n-type, then the first voltage is lower than the voltage of the body region; and if the body region is of the p-type, then the first voltage is higher than the voltage of the body region In the method for driving the semiconductor device, the second voltage is applied to the second trench gate electrode in the case where the return current flows in the diode element domain of the reverse conducting semiconductor device. The second voltage to be applied at this juncture is higher than the voltage of the body region if the first voltage is higher than the voltage of the body region. Furthermore, if the first voltage is lower than the voltage of the body region, then the second voltage is also lower than the voltage of the body region. That is, if the body region is of the n-type, then the second voltage is lower than the voltage of the body region, and if the body region is of the p-type, then the second voltage is higher than the voltage of the body region.

During the time in which the return current flows in the diode element domain of the reverse conducting semiconductor device, when the second voltage is applied to the second trench gate electrode, the inversion layer is formed in the body region adjacent to the second trench gate electrode. That is, a part of the body region of the second conductivity type is inversed to the first conductivity type. In such a circumstance, the first body contact region of the first conductivity type and the drift region of the first conductivity type are electrically communicated by the inversion layer having been inversed to the first conductivity type. As a result, the amount of carriers flowing between the drift region of the first conductivity type and the first body contact region of the first conductivity type can be increased. That is, in the diode element domain, a second conductivity type body region that forms a first conductivity type inversion layer when a voltage is applied to the second trench gate electrode is formed between the first conductivity type first body contact region and the first conductivity type drift region; thereby, a MOS transistor structure is included therein. When the second voltage is applied to the second trench gate electrode, the inversion layer is formed in the body region adjacent to the second trench gate electrode, and the MOS transistor structure included in the diode element domain turns on.

For example, assume that the body region is of the p-type, and the drift region is of the n-type. In this case, when the p-type impurity concentration of the body region is adjusted to an appropriate impurity concentration for the IGBT, the p-type impurity concentration is frequently too high as the body region for the diode. In such a case, the switching loss increases due to the injection efficiency of the holes in the diode being too high.

In the method of driving the semiconductor device of the present invention, during the time in which the return current flows in the diode element domain of the reverse conducting semiconductor device, a voltage that is higher than the voltage of the p-type body region is applied to the second trench gate electrode. As a result, the n-type inversion layer is formed in the body region adjacent to the second trench gate electrode. In such a circumstance, the n-type first body contact region and the n-type drift region are electrically communicated by the n-type inversion layer, and the electrons are enabled to flow therethrough. As a result, the amount of electrons flowing between the drift region and the first body contact region can be increased. Consequently, the injection efficiency of the holes (hole current/(hole current+electron current)) can be decreased, and the switching loss of the diode can be suppressed.

A similar phenomenon can be obtained in the case with the body region being the n-type. In this case also, when the n-type impurity concentration of the body region is adjusted to an appropriate impurity concentration for the IGBT, the n-type impurity concentration is frequently too high as the body region for the diode. In such a case, the switching loss increases due to the injection efficiency of the electrons in the diode being too high.

In the method of driving the semiconductor device of the present invention, during the time which the return current flows in the diode element domain of the reverse conducting semiconductor device, a voltage that is lower than the voltage of the n-type body region is applied to the second trench gate electrode. As a result, the p-type inversion layer is formed in the body region adjacent to the second trench gate electrode. In such a circumstance, the p-type first body contact region and the p-type drift region are electrically communicated by the p-type inversion layer, and the holes are enabled to flow therethrough. As a result, the amount of holes flowing between the drift region and the first body contact region can be increased. Consequently, the injection efficiency of the electrons (electron current/(hole current+electron current)) can be decreased, and the switching loss can be suppressed.

The present invention realizes a semiconductor device having the reverse conducting semiconductor device as mentioned above, a first gate voltage applying circuit controlling the voltage applied to the first gate electrode, and a second gate voltage applying circuit controlling the voltage applied to the second gate electrode.

In the semiconductor device of the present invention, each of the first and second gate voltage applying circuits applies the first voltage to at least the first trench gate electrode in the case where the IGBT element domain is maintained in the on-state, and applies the second voltage to at least the second trench gate electrode in the case where the return current flows in the diode element domain. At this juncture also, when the first voltage is higher than that of the body region, then the second voltage is higher than that of the body region, and when the first voltage is lower than that of the body region, then the second voltage is lower than that of the body region.

In the above case, during the time in which the first gate voltage applying circuit applies the first voltage to the first trench gate electrode, the second gate voltage applying circuit may be applying a voltage to the second trench gate electrode, or alternatively, may not be applying such a voltage. During the time in which the second gate voltage applying circuit applies the second voltage to the second trench gate electrode, the first gate voltage applying circuit may be applying a voltage to the first trench gate electrode, or alternatively, may not be applying such a voltage.

By utilizing the semiconductor device of the present invention, the injection efficiency of the holes or electrons generated in the diode element domain of the reverse conducting semiconductor device can be adjusted. While the impurity concentration that is most appropriate for the property of the IGBT is diverted for application in the diode element domain, the switching loss caused in the diode element domain can be suppressed.

In the semiconductor device of the present invention, the first and second gate voltage applying circuits are preferably composed by one single gate voltage applying circuit. By having the first and second gate voltage applying circuits being composed by one single gate voltage applying circuit, the mutual portions in the circuit structure can be unified. Thereby, the gate voltage applying circuit can be made smaller, and the production cost can be reduced.

Further, the magnitudes of the first voltage and the second voltage may be different, but alternatively, may be equal. In the case of being equal, the configuration of the gate voltage applying circuit becomes simpler.

The present invention may be realized in a method for driving a power supply device including at least two of the above-described reverse conducting semiconductor device.

In this power supply device, the first voltage is applied to at least the first trench gate electrode of one of the two reverse conducting semiconductor devices (hereinafter "the second reverse conducting semiconductor device") in a case where the IGBT element domain of the other of the two reverse conducting semiconductor device (hereinafter "the first reverse conducting semiconductor device") is switched to an off-state and an electric power is supplied by switching the IGBT element domain of the second reverse conducting semiconductor device to the on-state (first step). Subsequently, a second voltage is applied to at least the second trench gate electrode of the first reverse conducting semiconductor device in a case where the return current flows in the diode element domain of the first reverse conducting semiconductor device by switching the IGBT element domain of the second reverse conducting semiconductor device to the off-state (second step). The power supply device is driven by repeating the first step and the second step. Here, when the first voltage is higher than that of the body region of the second reverse conducting semiconductor device, then the second voltage is higher than that of the body region of the first reverse conducting semiconductor device, and when the first voltage is lower than that of the body region of the second reverse conducting semiconductor device, then the second voltage is lower than that of the body region of the first reverse conducting semiconductor device.

In the above case, in the first step, voltages may be applied to the second trench gate electrodes of the first and second reverse conducting semiconductor devices, or alternatively, may not apply such to the second trench gate electrodes of the first and second reverse conducting semiconductor devices. Furthermore, in the second step, voltages may be applied to the second trench gate electrode of the second reverse conducting semiconductor device and the first trench gate electrode of the first reverse conducting semiconductor device or alternatively, may not apply such to the second trench gate electrode of the second reverse conducting semiconductor device and the first trench gate electrode of the first reverse conducting semiconductor device.

In the method for driving the power supply device, during the time in which the return current flows in the diode element domain of the reverse conducting semiconductor device, the second voltage is applied to the second trench gate electrode of the first reverse conducting semiconductor device in which the return current flows. Thus, the injection efficiency of the holes or electrons caused in the diode element domain of the first reverse conducting semiconductor device can be adjusted. Due to this, the switching loss caused in the diode element domain of the reverse conducting semiconductor device can be suppressed.

Preferably, the method for driving the power supply device further comprises a third step of maintaining the IGBT element domain of at least the first reverse conducting semiconductor device in the off-state for a predetermined time before the IGBT element domain of the second reverse conducting semiconductor device is switched back to the on-state from the off-state.

In the second step, the application of the voltage to the first trench gate electrode of the first reverse conducting semiconductor device is optional. Thus, depending on the voltage applied to the first trench gate electrode of the first reverse conducting semiconductor device in the second step, the IGBT element domain of the first reverse conducting semiconductor device may enter the on-state in the second step.

In this method for driving the power supply device, prior to switching the IGBT element domain of the second reverse conducting semiconductor device back to the on-state, that is, prior to switching from the second step to the first step, the IGBT element domain of the first reverse conducting semiconductor device is made to be surely in the off-state. Thus, upon switching the IGBT element domain of the second reverse conducting semiconductor device to the on-state, the IGBT element domains of the first and second reverse conducting semiconductor devices are prevented from both being turned on. Hence, a large penetrating current is prevented from flowing in the IGBT element domains of the reverse conducting semiconductor devices, and the reverse conducting semiconductor devices composing the power supply device is prevented from being damaged.

Note that, in the third step, the IGBT element domain of the first reverse conducting semiconductor device merely needs to be in the off-state; thus, a voltage that will not turn the IGBT element domain of the first reverse conducting semiconductor device into the on-state may simply be applied to the first trench gate electrode of the first reverse conducting semiconductor device. As for the voltage to be applied to the first trench gate electrode, it is preferable that, if the first voltage is higher than the voltage of the body region of the second reverse conducting semiconductor device, then the voltage to be applied to the first trench gate electrode is set higher than the voltage of the body region of the first reverse conducting semiconductor device. Moreover, it is preferable that, if the first voltage is lower than the voltage of the body region of the second reverse conducting semiconductor device, then the voltage to be applied to the first trench gate electrode is set lower than the voltage of the body region of the first reverse conducting semiconductor device. When a voltage according to the above is applied, in the third step, the body region adjacent to the first trench gate electrode of the first reverse conducting semiconductor device is inversed to the first conductivity type.

In this power supply device, in the third step, the second reverse conducting semiconductor device is in the off-state; thus, in the third step also, the return current flows in the diode element domain of the first reverse conducting semiconductor device. In this method of driving the power supply device, in the third step, the inversion layer is formed in the body region adjacent to the first trench gate electrode of the first reverse conducting semiconductor device. Thus, the impurities of the second conductive type included in the body region of the first reverse conducting semiconductor device are prevented from being retained in a region that is close to the first trench gate electrode. That is, when the return current flows in the diode element domain of the first reverse conducting semiconductor device, the concentration of the second conductivity type impurities included in the body region of the first reverse conducting semiconductor device is prevented from being decreased. A resistance in the diode element domain of the first reverse conducting semiconductor device is prevented from being increased.

In this method for driving the power supply device, preferably, in the third step, a third voltage is applied to the second trench gate electrode of the first reverse conducting semiconductor device. Here, when the first voltage is higher than that of the body region of the second reverse conducting semiconductor device, then the third voltage is higher than that of the body region of the first reverse conducting semiconductor device, and when the first voltage is lower than that of the body region of the second reverse conducting semiconductor device, then the third voltage is lower than that of the body region of the first reverse conducting semiconductor device.

In this method for driving the power supply device, in the third step, the third voltage is applied to the second trench gate electrode of the first reverse conducting semiconductor device. Thus, the inversion layer is formed in the body region adjacent to the second trench gate electrode of the first reverse conducting semiconductor device, and the injection efficiency of the holes or electrons caused in the diode element domain of the first reverse conducting semiconductor device, in which the return current flows in the third step, can be adjusted. Due to this, the switching loss generated in the diode element domain of the reverse conducting semiconductor device can be suppressed even in the third step.

In this method for driving the power supply device, in a case where the first step is to be performed by switching the IGBT element domain of the second reverse conducting semiconductor device to the on-state from the off-state after the third step, the voltage of the diode element domain of the first reverse conducting semiconductor device is measured, and the third voltage is applied to at least the second trench gate electrode of the first reverse conducting semiconductor device until the voltage of the diode element domain of the first reverse conducting semiconductor device exceeds a threshold voltage that causes the return current of the diode element domain of the first reverse conducting semiconductor device.

For example, assume that the body region is of the p-type, and the drift region is of the n-type. In this case, when the p-type impurity concentration of the body region is adjusted to the appropriate impurity concentration for the IGBT, the p-type impurity concentration is frequently too high as the body region for the diode. In this case, when the IGBT element domain of the second reverse conducting semiconductor device is to be switched back to the on-state, the p-type impurities are injected in the drift region of the first reverse conducting semiconductor device at a high concentration. Upon the IGBT element domain of the second reverse conducting semiconductor device being switched back to the on-state, when the p-type impurities having been injected in the drift region of the first reverse conducting semiconductor device are returned to the body region all at once, a very large reverse recovery current is generated, and the switching loss is increased.

A similar phenomenon can be obtained in the case with the body region being the n-type. In this case also, when the n-type impurity concentration of the body region is adjusted to the appropriate impurity concentration for the IGBT, the n-type impurity concentration is frequently too high as the body region for the diode. In such a case also, a large reverse recovery current is generated, and the switching loss is increased.

In this method for driving the power supply device, the third voltage is kept applied to the second trench gate electrode of the first reverse conducting semiconductor device until a timing at which the reverse recovery current flows in the diode element domain of the first reverse conducting semiconductor device. Due to this, in an early stage of the first step, the second conductivity type impurities injected in the drift region of the first reverse conducting semiconductor device are prevented from returning to the body region all at once. The switching loss generated in the power supply device can be suppressed.

According to the present invention, in the case where the semiconductor region that compose the IGBT element domain and the diode element domain have a mutual impurity concentration, the injection efficiency of the holes or electrons generated in the return diode can be adjusted to the desired value. Consequently, the switching loss in the diode can be suppressed.

DETAILED DESCRIPTION

Some major features of the embodiments described below will be listed first.

(Feature 1) A first trench gate electrode and a second trench gate electrode are electrically connected.

(Feature 2) In a power supply device in which the first trench gate electrode and the second trench gate electrode are electrically connected, a third voltage is set as below:

(1) when a first voltage is higher than a voltage of a body region of a second reverse conducting semiconductor device, then the third voltage is higher than a voltage of a body region of a first reverse conducting semiconductor device and lower than a threshold voltage of an IGBT element domain of the first reverse conducting semiconductor device; and (2) when the first voltage is lower than the voltage of the body region of the second reverse conducting semiconductor device, then the third voltage is lower than the voltage of the body region of the first reverse conducting semiconductor device and higher than the threshold voltage of the IGBT element domain of the first reverse conducting semiconductor device.

First Embodiment

Figure 1:
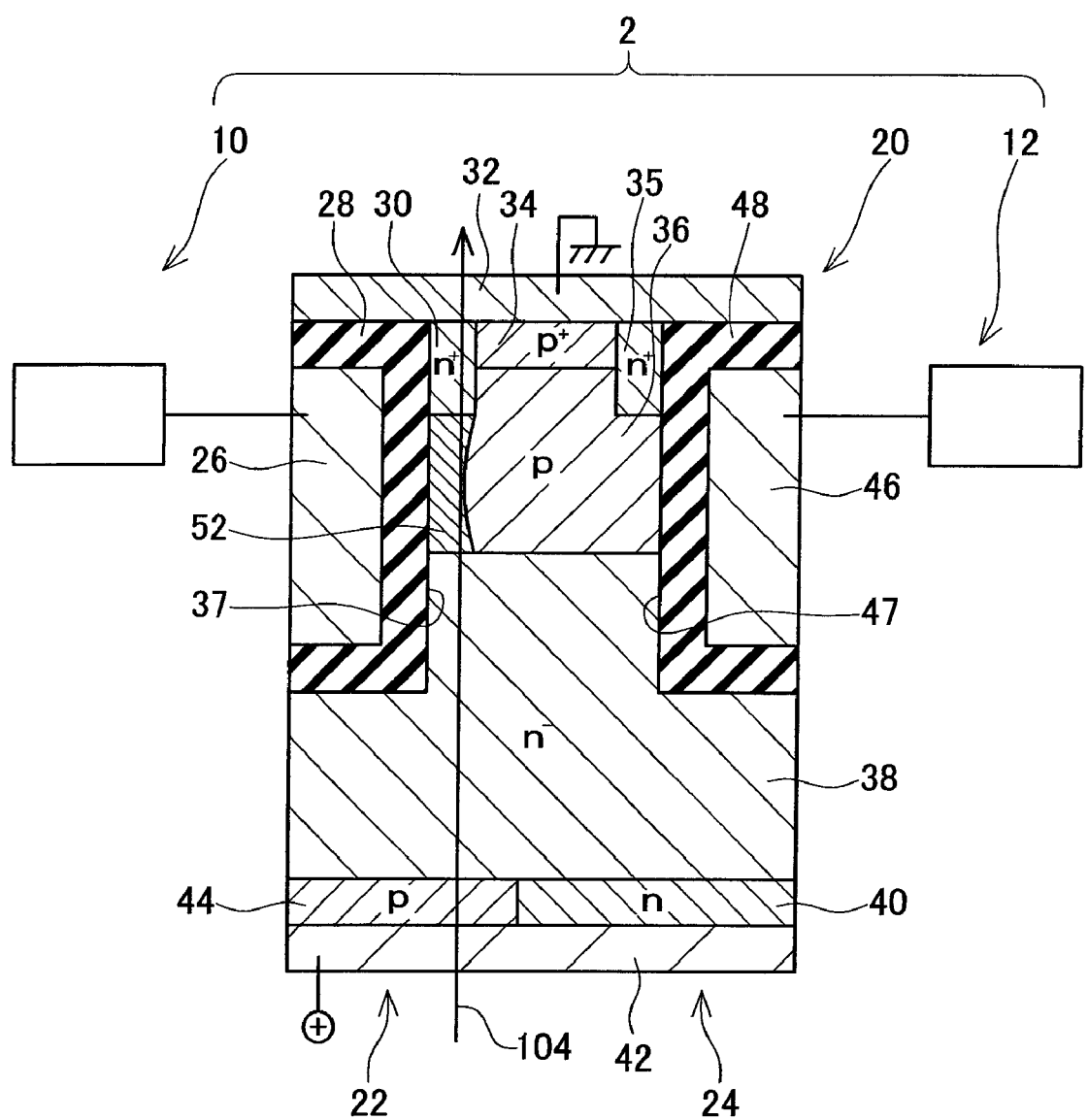
FIG. 1 schematically shows a structure of a semiconductor device 2.

A semiconductor device 2 that embodies the present invention is shown in FIG. 1. The semiconductor device 2 comprises a first gate voltage applying circuit 10, a second gate voltage applying circuit 12, and a reverse conducting semiconductor device 20. The first gate voltage applying circuit 10 is electrically connected to a first trench gate electrode 26 of the reverse conducting semiconductor device 20. The second gate voltage applying circuit 12 is electrically connected to a second trench gate electrode 46 of the reverse conducting semiconductor device 20.

The reverse conducting semiconductor device 20 includes an insulated gate bipolar transistor (hereinbelow "IGBT") element domain 22 and a diode element domain 24 formed within one mutual semiconductor substrate. FIG. 1 shows a cross section around a border portion of the IGBT element domain 22 and the diode element domain 24.

The reverse conducting semiconductor device 20 is formed from a piece of semiconductor substrate that includes n-type impurities at a low concentration. By a part that is left unprocessed in the semiconductor substrate, a drift region 38 is formed. On a surface side of the drift region 38, a body region 36 including p-type impurities is laminated. The drift region 38 and the body region 36 are extending evenly regardless of being within the IGBT element domain 22 or the diode element domain 24.

In the IGBT element domain 22, at a position that faces a surface of the body region 36, emitter regions 30 including the n-type impurities at a high concentration are formed with regular intervals therebetween. Each of the emitter regions 30 is separated from the drift region 38 by the body region 36. At a range facing the surface of the body region 36 between the adjacent emitter reigns 30, a body contact region 34 including the p-type impurities at a high concentration is formed respectively.

In the diode element domain 24, first body contact regions 35 including the n-type impurities at a high concentration are formed with regular intervals therebetween. Each of the first body contact regions 35 is separated from the drift region 38 by the body region 36. At a range facing the surface of the body region 36 between the adjacent first body contact regions 35, a second body contact region 34 including the p-type impurities at a high concentration is formed respectively. The region 34 in FIG. 1 is the body contact region 34 of the IGBT element domain 22, and at the same time, is the second body contact region 34 of the diode element domain 24. The p-type body region 36 in the diode element domain 24 and the p-type second body contact region 34 compose an anode region of a diode.

In the IGBT element domain 22, from a surface of each of the emitter regions 30, a first trench 37 that penetrates the emitter region 30 and the body region 36 and reaches the drift region 38 is formed. A wall surface of each of the first trenches 37 is covered with a gate insulating film 28, and a first trench gate electrode 26 is filled inside each of the first trenches 37.

In the diode element domain 24, from a surface of each of the first body contact regions 35, a second trench 47 that penetrates the first body contact regions 35 and the body region 36 and reaches the drift region 38 is formed. A wall surface of each of the second trenches 47 is covered with a gate insulating film 48, and a second trench gate electrode 46 is filled inside each of the second trenches 47.

On the surface of the reverse conducting semiconductor device 20, an emitter electrode 32 is formed. The emitter electrode 32 is electrically communicated with the emitter region 30 and the body contact region 34 in the IGBT element domain 22, and is electrically communicated with the first body contact region 35 and the second body contact region 34 in the diode element domain 24. The first trench gate electrodes 26 are exposed at the surface of the reverse conducting semiconductor device 20 in a cross-section that is not shown, and are connected to the first gate voltage applying circuit 10. Further, the second trench gate electrodes 46 are exposed at the surface of the reverse conducting semiconductor device 20 in a cross-section that is not shown, and are connected to the second gate voltage applying circuit 12.

In the IGBT element domain 22, on a rear surface side of the drift region 38, a collector region 44 including p-type impurities is formed. In the diode element domain 24, on the rear surface side of the drift region 38, a drift contact region 40 including n-type impurities is formed. The n-type drift region 38 and the n-type drift contact region 40 in the diode element domain 24 compose a cathode region of the diode.

On a rear surface of the reverse conducting semiconductor device 20, a collector electrode 42 is formed. The collector electrode 42 is electrically communicated with the collector region 44 and the drift contact region 40.

In the region 22 where the collector region 44 is formed, the reverse conducting semiconductor device 20 operates as an IGBT. In the region 22 that operates as the IGBT, the $n^+$-type emitter region 30, the p-type body region 36, the $n^-$-type drift region 38 and the p-type collector region 44 are laminated. The first trench gate electrodes 26 that penetrate the body region 36 that separates the emitter region 30 from the drift region 38 are formed.

As shown in FIG. 1, when a first voltage that is a positive voltage equal to or larger than a threshold voltage Vth is applied to the first trench gate electrode 26 under a state in which a positive voltage is applied to the collector electrode 42 and having the emitter electrode 32 grounded, an n-type inversion layer 52 is formed in the body region 36 around the first trench gate electrode 26, and electrons from the emitter region 30 are injected to the drift region 38 via the inversion layer 52. In accordance with this, holes from the collector region 44 are injected to the drift region 38. Due to the electrons and holes being injected to the drift region 38, a conductivity modulation is activated. Due to this, the collector electrode 42 and the emitter electrode 32 are electrically communicated, and a current 104 flows. This state is referred to as an "on-state". The IGBT has a lower on-voltage for it makes use of this conductivity modulation.

When the application of the positive voltage equal to or larger than the threshold voltage Vth to the first trench gate electrode 26 is stopped, the electrons are ceased from being injected to the drift region 38 from the emitter region 30. This state is referred to as an "off-state". The IGBT element domain 22 is controlled to be in the on-state during the time when the positive voltage equal to or larger than the threshold voltage Vth is applied to the first trench gate electrode 26, and is controlled to be in the off-state when the application of the positive voltage equal to or larger than the threshold voltage Vth to the first trench gate electrode 26 is stopped.

In a case where an inverter circuit (which is one type of a power supply device) is composed by using a plurality of IGBT elements, when one IGBT element is switched to the off-state, a large voltage may be applied to the IGBT element due to an inducing component of an electric load, causing damage in the element. Thus, a circuit in which the current that keeps flowing due to the inducing component of the electric load upon switching the IGBT element to the off-state is made to flow to the diode by connecting the diode in parallel to the IGBT element is widely known. Hereinbelow, such a diode is referred to as a "freewheeling diode", and the current flowing in this diode is referred to as a "return current".

The diode element domain 24 of the reverse conducting semiconductor device 20 operates as the freewheeling diode. That is, in the domain 24 where the drift contact region 40 is formed, the reverse conducting semiconductor device 20 operates as the freewheeling diode.

In the domain 24 that operates as the freewheeling diode, the p-type body region 36, the $n^-$-type drift region 38 and the n-type drift contact region 40 are laminated. The $n^+$-type first body contact region 35 and the $p^+$-type second body contact region 34 are formed on the surface of the p-type body region 36. The second trench gate electrodes 46 that penetrate the body region 36 that separates the first body contact region 35 from the drift region 38 is formed.

When a positive voltage that is higher than a potential of the collector electrode 42 is applied to the emitter electrode 32, a diode in which the p-type second body contact region 34 and the p-type body region 36 function as the anode, and the $n^-$-type drift region 38 and the drift contact region 40 function as the cathode is formed.

Figure 2:
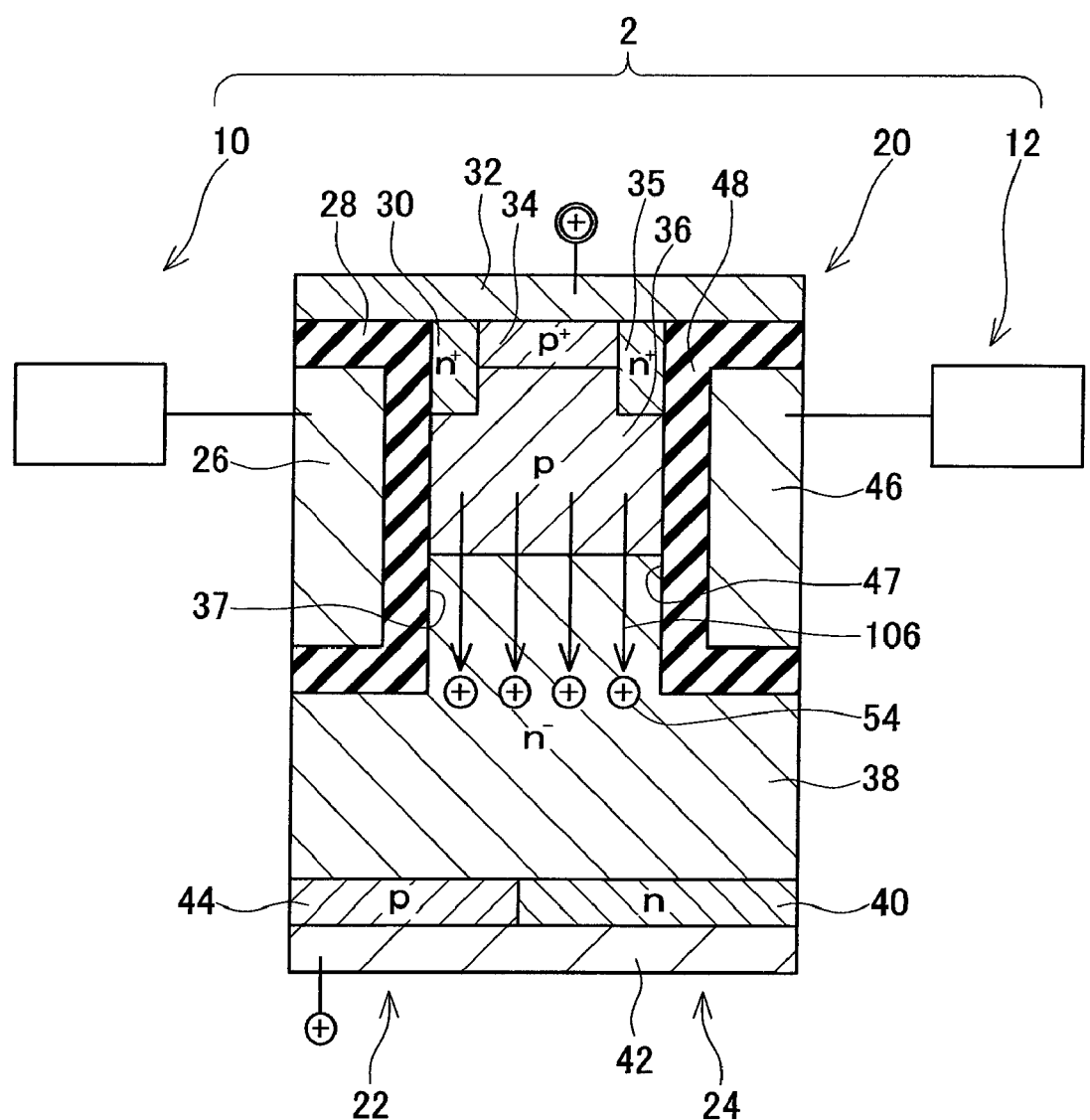
FIG. 2 schematically shows the structure of the semiconductor device 2.

As shown in FIG. 2, when the positive voltage that is higher than the potential of the collector electrode 42 is applied to the emitter electrode 32, the return current 106 flows. In accordance with the property of the IGBT, the impurity concentration of the p-type body region 36 is set higher than the impurity concentration of the $n^-$-type drift region 38. This relationship in the impurity concentration is maintained in the diode element domain 24 as well. Therefore, a large amount of the holes 54 flow into the drift region 38 having the lower impurity concentration from the body region 36 having the higher impurity concentration. That is, in the diode element domain 24, the injection efficiency of the holes 54 becomes larger.

Figure 3:
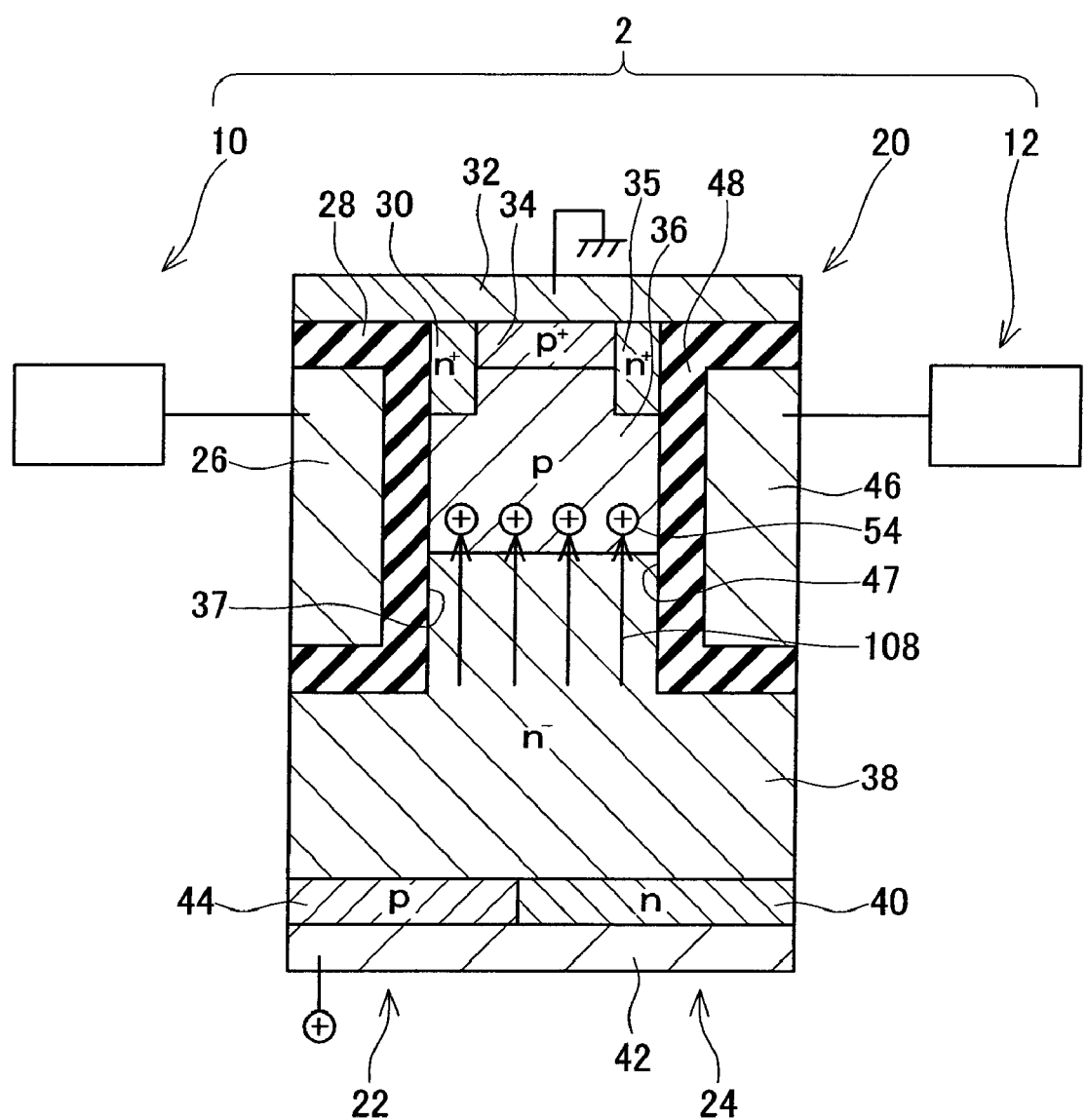
FIG. 3 schematically shows the structure of the semiconductor device 2.

In such a case, when the voltage of the emitter electrode 32 becomes lower than the voltage of the collector electrode 42, as shown in FIG. 3, the holes 54 having been stocked in the drift region 38 returns to the body region 36, and a reverse recovery current 108 flows. When such a large reverse recovery current 108 flows, the switching loss increases. The magnitude of the switching loss is dependent on the injection efficiency of the holes 54 to the drift region 38. In order to suppress the switching loss, the impurity concentrations of the drift region 38 and the body region 36 need to be adjusted to fit with the property required to the diode element domain 24, and adjust the injection efficiency of the holes 54. However, in the reverse conducting semiconductor device 20, the impurity concentrations of the drift region 38 and the body region 36 are set to fit with the property of the IGBT element domain 22, and thus cannot be adjusted to fit with the property required to the diode element domain 24. Therefore, the switching loss in the diode element domain 24 becomes large. In the present embodiment, the switching loss in the diode element domain 24 is made small by using the second trench gate electrodes 26 existing in the diode element domain 24.

Figure 4:
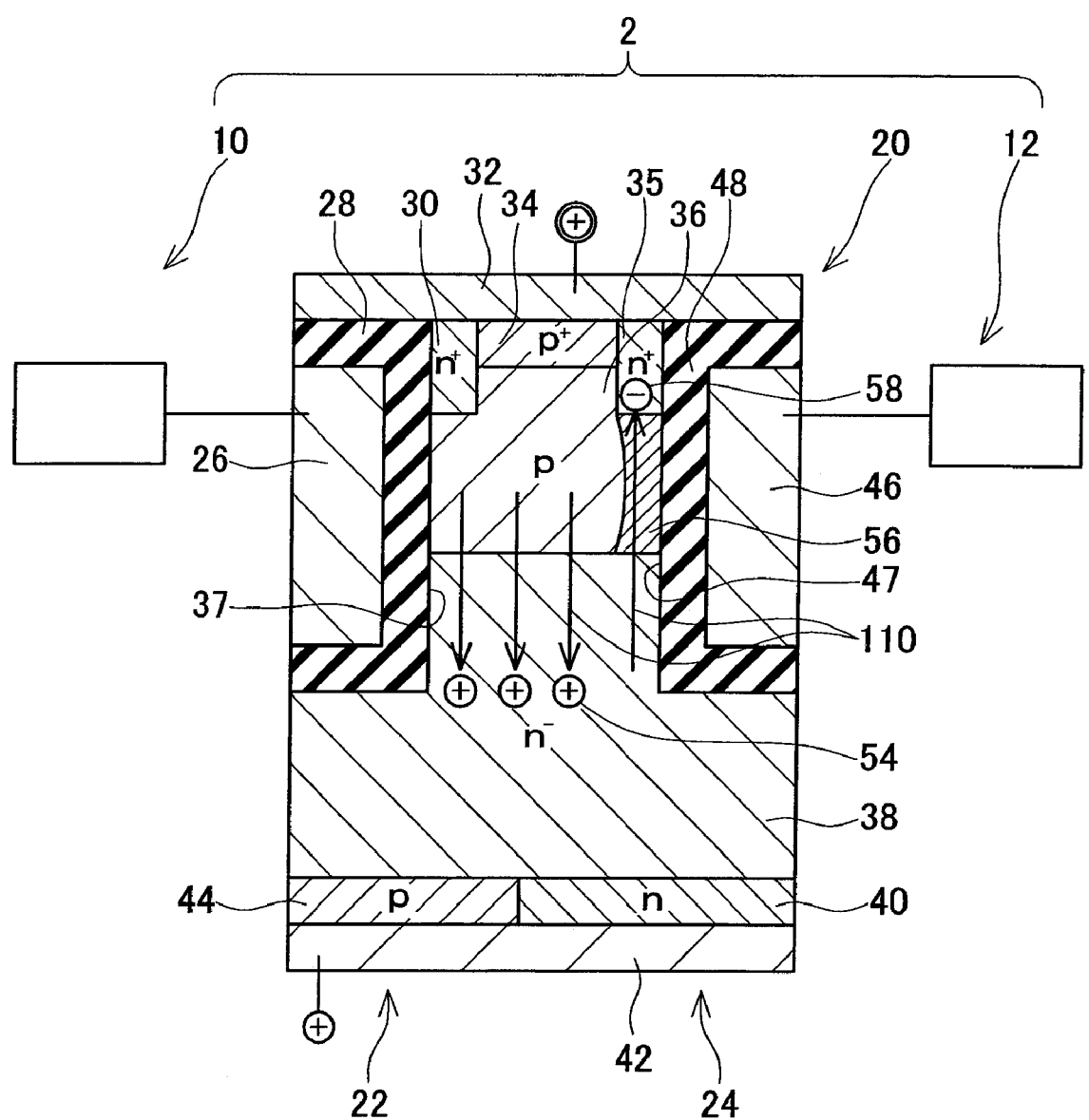
FIG. 4 schematically shows the structure of the semiconductor device 2.

FIG. 4 shows the case in which a positive voltage that is higher than the voltage of the collector electrode 42 is applied to the emitter electrode 32, and a return current 110 flows in the diode element domain 24. In this case, a second voltage that is a positive voltage that is higher than the voltage of the emitter electrode 32 (which is equal to the voltage of the body region 36) is applied to the second trench gate electrodes 46. When the aforesaid positive voltage is applied to the second trench gate electrode 46, an n-type inversion layer 56 is formed in the body region 36 around the second trench gate electrode 46. Thus, in between the emitter electrode 32 and the collector electrode 42, the n-type first body contact region 35, the n-type inversion layer, the n-type drift region 38 and the n-type drift contact region 40 are continuously arranged. Due to this, the electrons 58 can flow from the collector electrode 42 to the emitter electrode 32 through the aforesaid continuing n-type regions. According to this, the injection efficiency of the electrons 58 in the diode element domain 24 increases, and the injection efficiency of the holes 54 thereof decreases. The injection efficiency of the holes can be adjusted to the appropriate value, and the switching loss occurring in the diode element domain 24 can be suppressed. By utilizing the phenomenon explained with reference to FIG. 4, the reverse recovery current is prevented from developing into a large value. Consequently, the varying speed of the reverse recovery current can be suppressed, and the surge voltage caused by the varying speed of the reverse recovery current can be suppressed to a small value. Damaging of the reverse conducting semiconductor device 20 caused by the excessive surge voltage can be prevented.

Second Embodiment

Figure 5:
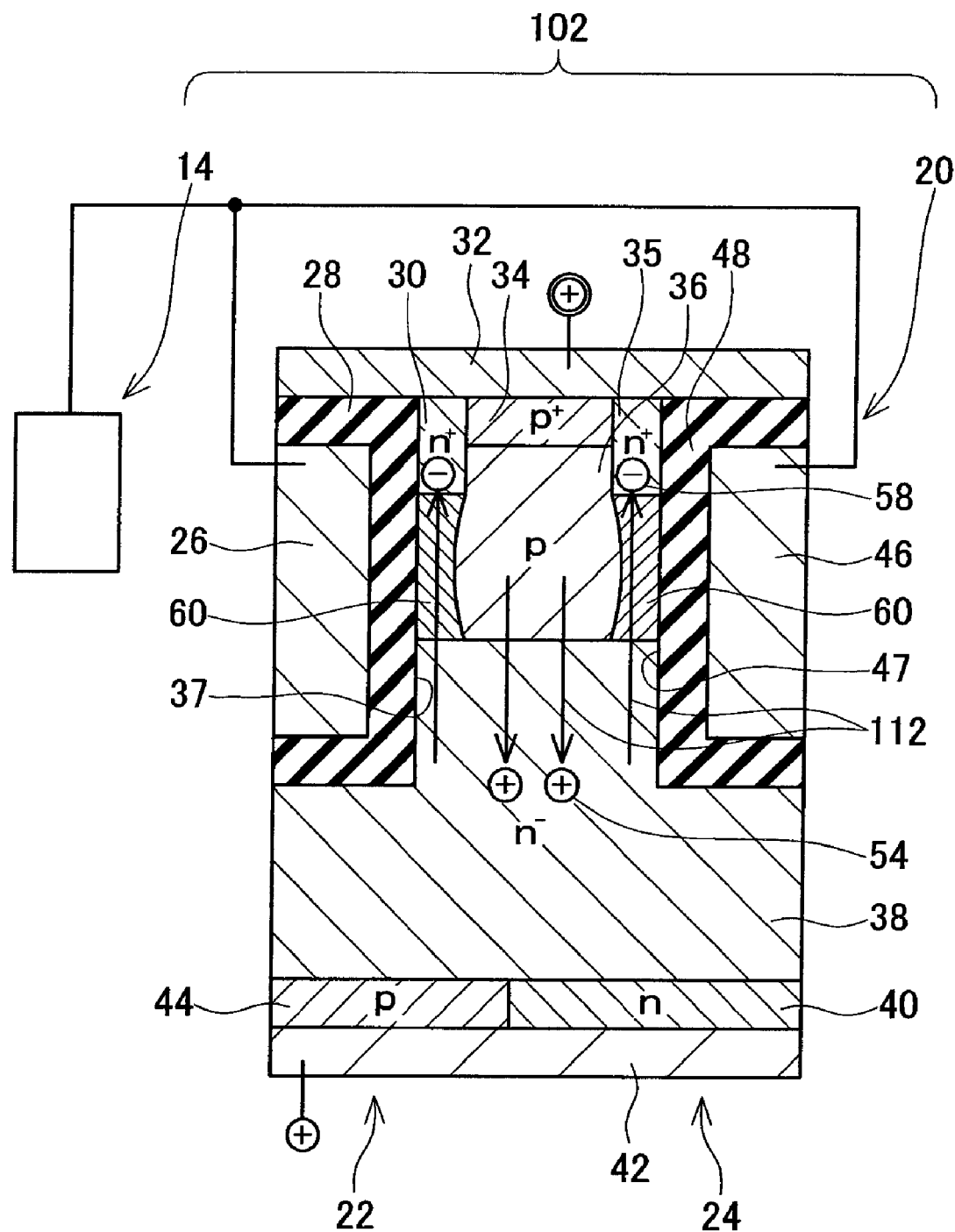
FIG. 5 schematically shows a structure of a semiconductor device 102.

FIG. 5 shows a cross sectional view of a semiconductor device 102 of the second embodiment of the present invention. The semiconductor device 102 of the present embodiment comprises a gate voltage applying circuit 14 and the reverse conducting semiconductor device 20. The semiconductor device 102 of the present embodiment has first trench gate electrodes 26 and second trench gate electrodes 46 electrically connected, and they are mutually connected to the gate voltage applying circuit 14.

In the semiconductor device 102 of the present embodiment, in a case where a positive voltage that is higher than a voltage of a collector electrode 42 is applied to an emitter electrode 32, and a return current 112 flows in a diode element domain 24, a second voltage that is a positive voltage higher than a voltage of the emitter electrode 32 is applied to both the first trench gate electrodes 26 and the second trench gate electrodes 46. Due to this, an inversion layer 60 is formed in the body regions 36 around the first trench gate electrodes 26 and the second trench gate electrodes 46 respectively. Through the respective inversion layer 60, the electrons 58 from the collector electrode 42 can be made to flow to the emitter electrode 32. According to this, a rate of the electron flow in the diode element domain 24 can further be increased, and a switching loss occurring in the diode element domain 24 can further be suppressed.

Third Embodiment

Figure 6:
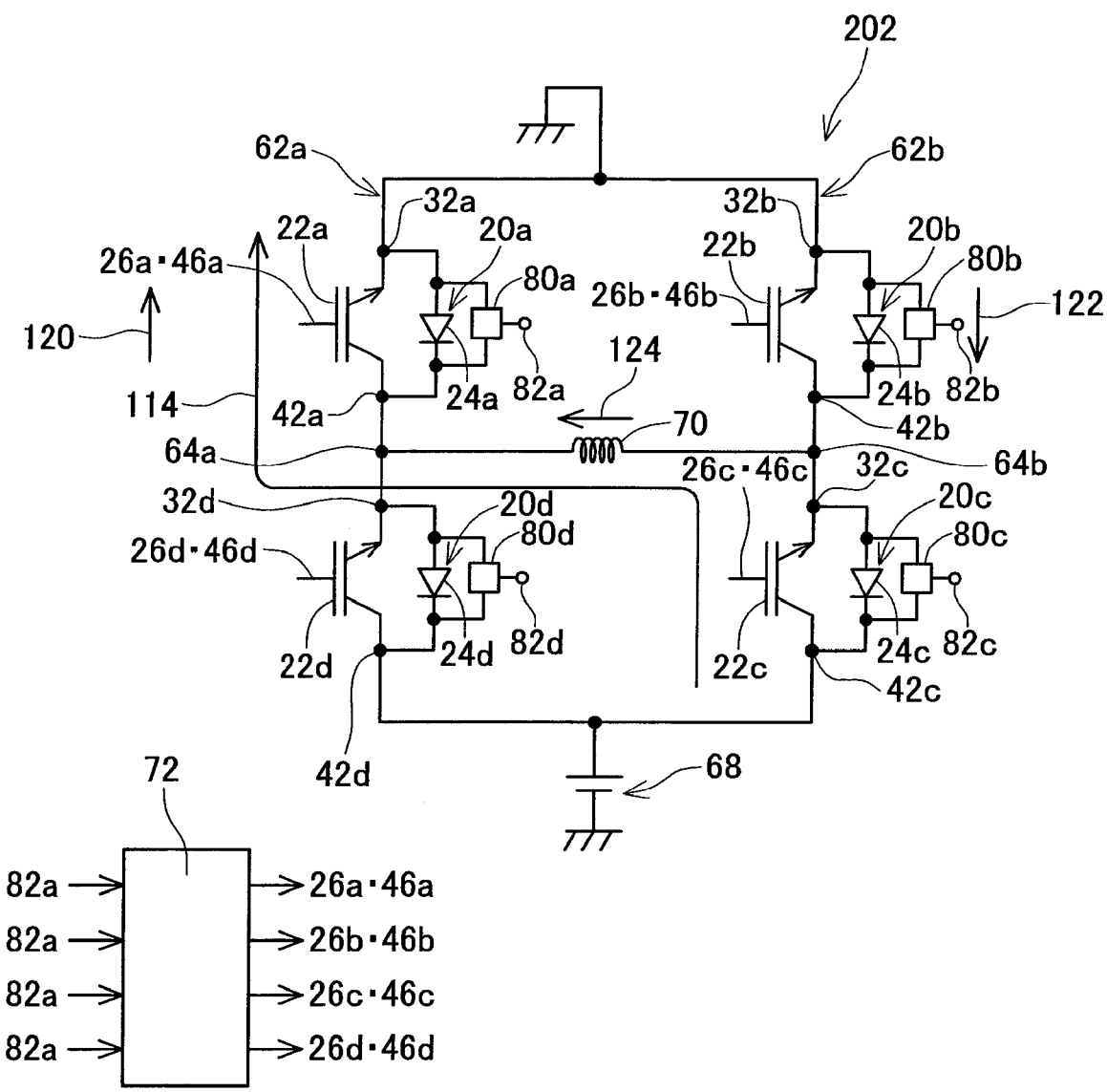
FIG. 6 schematically shows a structure of a power supply device 202.

FIG. 6 shows a power supply device 202 using the driving method of the present invention. Alphabet letters are used subsequent to the reference numbers, and in the description below, abbreviation of the alphabet letters means that the description is mutual to the components having the same reference number.

As shown in FIG. 6, the power supply device 202 comprises a serial circuit 62a in which two reverse conducting semiconductor devices 20a, 20d are serially connected, and a serial circuit 62b in which two reverse conducting semiconductor devices 20b, 20c are serially connected. The serial circuit 62a and the serial circuit 62b independently configure a power supply device, and in the present embodiment, an explanation will be given based on the power supply device 202 in which the serial circuit 62a and the serial circuit 62b are connected in parallel.

An emitter electrode 32a of the reverse conducting semiconductor device 20a is grounded. A collector electrode 42d of the reverse conducting semiconductor device 20d is connected to a positive power source of a DC power source 68. A collector electrode 42a of the reverse conducting semiconductor device 20a and an emitter electrode 32d of the reverse conducting semiconductor device 20d are connected to an intermediate potential point 64a of the serial circuit 62a. The intermediate potential point 64a of the serial circuit 62a is connected to one terminal of a motor coil 70. An emitter electrode 32b of the reverse conducting semiconductor device 20b is grounded. A collector electrode 42c of the reverse conducting semiconductor device 20c is connected to the positive power source of the DC power source 68. A collector electrode 42b of the reverse conducting semiconductor device 20b and an emitter electrode 32c of the reverse conducting semiconductor device 20c are connected to an intermediate potential point 64b of the serial circuit 62b. The intermediate potential point 64b of the serial circuit 62b is connected to another terminal of the motor coil 70. The motor coil 70 is an electric load having an inductance component.

Similar to the second embodiment, first trench gate electrodes 26a and second trench gate electrodes 46a of the reverse conducting semiconductor device 20a are electrically connected, and they are mutually connected to a gate voltage applying circuit 72. Similarly, first trench gate electrodes 26b and second trench gate electrodes 46b of the reverse conducting semiconductor device 20b are electrically connected, and they are mutually connected to the gate voltage applying circuit 72 also. First trench gate electrodes 26c and second trench gate electrodes 46c of the reverse conducting semiconductor device 20c are electrically connected, and they are mutually connected to the gate voltage applying circuit 72 also. First trench gate electrodes 26d and second trench gate electrodes 46d of the reverse conducting semiconductor device 20d are electrically connected, and they are mutually connected to the gate voltage applying circuit 72 also. In each of the reverse conducting semiconductor devices 20, voltages of the first trench gate electrodes 26 and the second trench gate electrodes 46 are equal. The gate voltage applying circuit 72 independently controls the trench gate voltages of the respective reverse conducting semiconductor devices 20a, 20b, 20c, 20d.

Further, a voltage measuring device 80a is connected to a diode element domain 24a of the reverse conducting semiconductor device 20a. The voltage measuring device 80a measures the voltage applied to the diode element domain 24a. An output terminal 82a of the voltage measuring device 80a is connected to the gate voltage applying circuit 72, and the voltage value measured by the voltage measuring device 80a is transmitted to the gate voltage applying circuit 72. Similarly, a voltage measuring device 80b is connected to a diode element domain of the reverse conducting semiconductor device 20b. The voltage measuring device 80b measures the voltage applied to the diode element domain 24b, and transmits the measured voltage value to the gate voltage applying circuit 72 via an output terminal 82b. A voltage measuring device 80c is connected to a diode element domain 24c of the reverse conducting semiconductor device 20c. The voltage measuring device 80c measures the voltage applied to the diode element domain 24c, and transmits the measured voltage value to the gate voltage applying circuit 72 via an output terminal 82c. A voltage measuring device 80d is connected to a diode element domain of the reverse conducting semiconductor device 20d. The voltage measuring device 80d measures the voltage applied to the diode element domain 24d, and transmits the measured voltage value to the gate voltage applying circuit 72 via an output terminal 82d.

Figure 8:
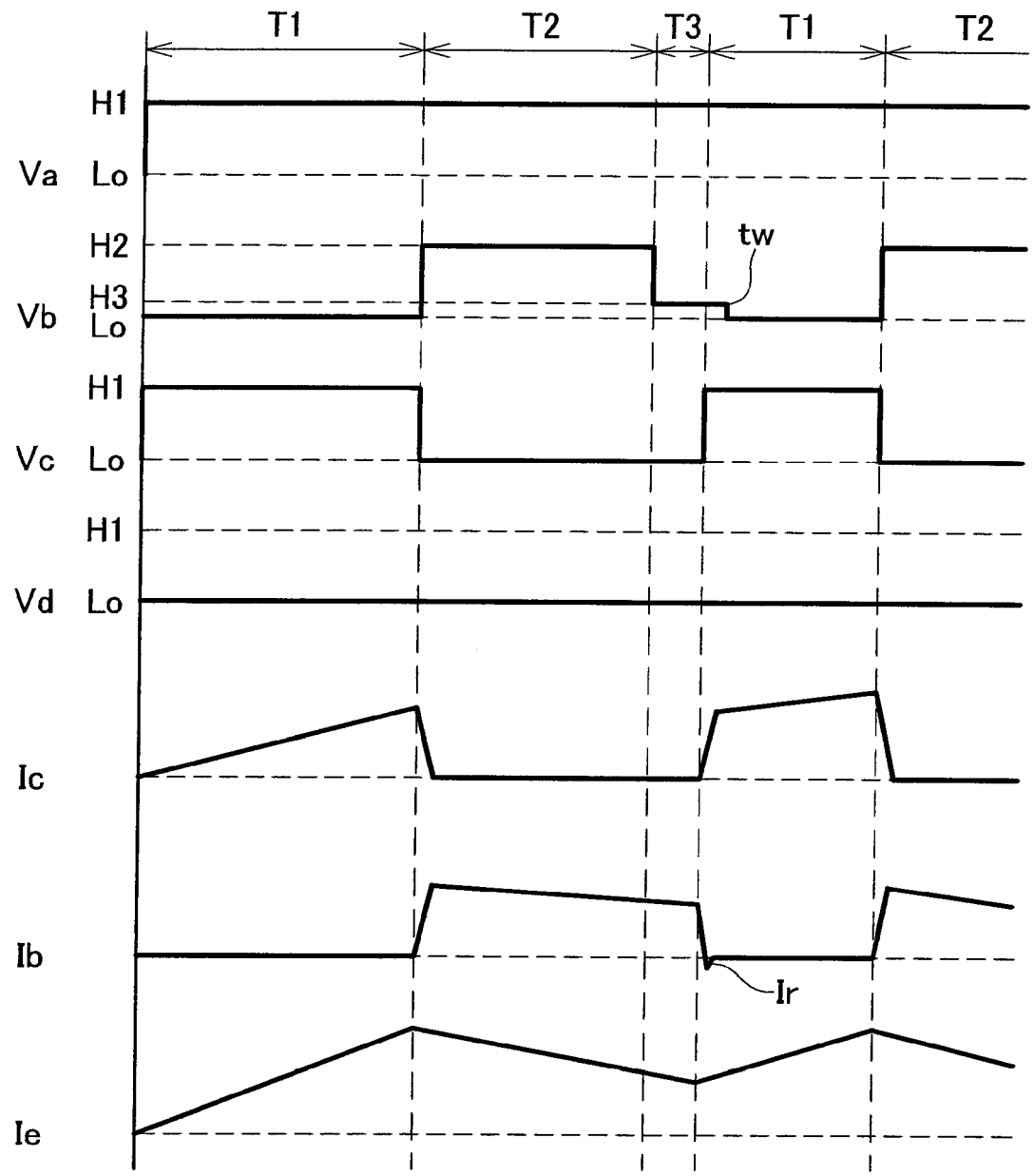
FIG. 8 shows a time chart of the power supply device 202.

The power supply device 202 of the present embodiment adjusts power to be supplied to the motor coil 70 by independently controlling trench gate voltages of the respective reverse conducting semiconductor devices 20a, 20b, 20c, 20d over time. In a time chart of FIG. 8, manners by which the trench gate voltages applied to the respective reverse conducting semiconductor devices 20a, 20b, 20c, 20d change are shown. A voltage Va in FIG. 8 shows the voltage applied to the trench gate electrode of the reverse conducting semiconductor devices 20a. The attached alphabetical letters "b", "c" and "d" are dealt as aforementioned. As stated above, in the power supply device 202 of the present embodiment, the voltages to be applied to the first trench gate electrodes 26 of the respective reverse conducting semiconductor devices 20 are equal to the voltages to be applied to the second trench gate electrodes 46 thereof.

A voltage H1 in FIG. 8 is the first voltage (positive voltage) that is set equal to or greater than a threshold voltage by which the IGBT element domains 22 of the reverse conducting semiconductor devices 20 are turned on. By applying the voltage H1, the IGBT element domains 22 become conductive. A voltage H2 in FIG. 8 is the second voltage (positive voltage) that is set equal to or greater than a voltage by which the inversion layer is formed in the diode element domains 24 of the reverse conducting semiconductor devices 20. By applying the voltage H2, a current path having the same conductive type is formed between the emitter electrode 32 and the collector electrode 42 of the respective diode element domains 24. A voltage H3 in FIG. 8 is a third voltage (positive voltage) that is set smaller than the threshold voltage by which the IGBT element domains 22 of the reverse conducting semiconductor devices 20 are turned on and equal to or greater than the voltage by which the inversion layer is formed in the diode element domains 24 of the reverse conducting semiconductor devices 20. By applying the voltage H3, the IGBT element domains 22 become non-conductive, whereas on the other hand, the current path having the same conductive type is formed between the emitter electrode 32 and the collector electrode 42 of the respective diode element domains 24. The voltage H1 and the voltages 112 and H3 are mutually higher than the voltage of the body regions 36. In the present embodiment, the voltage H1 and the voltage H2 are set to be equal, and the voltage H1 and the voltage 112 are set to be higher than the voltage H3.

A voltage Lo indicates a voltage that is lower than any of the threshold voltage of the IGBT element domains 22 and the voltage by which the inversion layer is formed in the diode element domains 24 of the reverse conducting semiconductor devices 20. By applying the voltage Lo, the IGBT element domains 22 become non-conductive, and the current path having the same conductive type is not formed in the respective diode element domains 24. In the present embodiment, the voltage Lo is a voltage used in an occasion in which the gate voltage applying circuit 72 does not apply any voltage to the first trench gate electrodes 26 and the second trench gate electrodes 46. When the gate voltage applying circuit 72 stops applications of the voltage H1, voltage H2 or voltage H3 to the first trench gate electrodes 26 and the second trench gate electrodes 46, the voltage Lo is applied to the first trench gate electrodes 26 and the second trench gate electrodes 46.

Ic in FIG. 8 shows a magnitude of the current flowing in the reverse conducting semiconductor device 20c in a direction of an arrow 120 of FIG. 6. Ib in FIG. 8 shows a magnitude of the current flowing in the reverse conducting semiconductor device 20b in a direction of an arrow 122 of FIG. 6. Ie in FIG. 8 shows a magnitude of the current flowing in the motor coil 70 in a direction of an arrow 124 of FIG. 6.

In a first period shown as T1 in FIG. 8, as shown in FIG. 6, the IGBT element domain 22a of the reverse conducting semiconductor device 20a on one side of the serial circuit 62a (which is the low voltage side in the present case) is made to enter the on-state. In addition, the IGBT element domain 22d of the reverse conducting semiconductor device 20d on another side of the serial circuit 62a (which is the high voltage side in the present case) is made to enter the off-state. Further, the IGBT element domain 22b of the reverse conducting semiconductor device 20b on one side of the serial circuit 62b (the low voltage side) is made to enter the off-state. In addition, the IGBT element domain 22c of the reverse conducting semiconductor device 20c on another side of the serial circuit 62b (the high voltage side) is made to enter the on-state. That is, the voltage H1 is applied to the first trench gate electrodes 26a of the reverse conducting semiconductor device 20a and the first trench gate electrodes 26c of the reverse conducting semiconductor device 20c. In addition, the voltage Lo is applied to the first trench gate electrodes 26b of the reverse conducting semiconductor device 20b and the first trench gate electrodes 26d of the reverse conducting semiconductor device 20d. According to this, from the DC power source 68, a current 114 flows through the reverse conducting semiconductor device 20c, the motor coil 70 and the reverse conducting semiconductor device 20a. At this occasion, the voltage H1 is applied to the second trench gate electrodes 46a of the reverse conducting semiconductor device 20a and the second trench gate electrodes 46c of the reverse conducting semiconductor device 20c as well. As a result, current flows through the diode element domains 24a, 24c. No problem will occur due to the currents flowing through both the IGBT element domains 22a, 22c and the diode element domains 24a, 24c. Furthermore, the voltage Lo is applied to the second trench gate electrodes 46b of the reverse conducting semiconductor device 20b and the second trench gate electrodes 46d of the reverse conducting semiconductor device 20d as well. The inversion layers are not formed in the diode element domains 24b, 24d. The current will not flow in the reverse conducting semiconductor device 20b and the reverse conducting semiconductor device 20d.

Next, when the process enters a second period indicated with T2 in FIG. 8, the IGBT element domain 22c of the reverse conducting semiconductor device 20c that had been on until then is switched to the off-state. The IGBT element domain 22d of the reverse conducting semiconductor device 20d is maintained in the off-state, and the IGBT element domain 22a of the reverse conducting semiconductor device 20a is maintained in the on-state.

Figure 7:
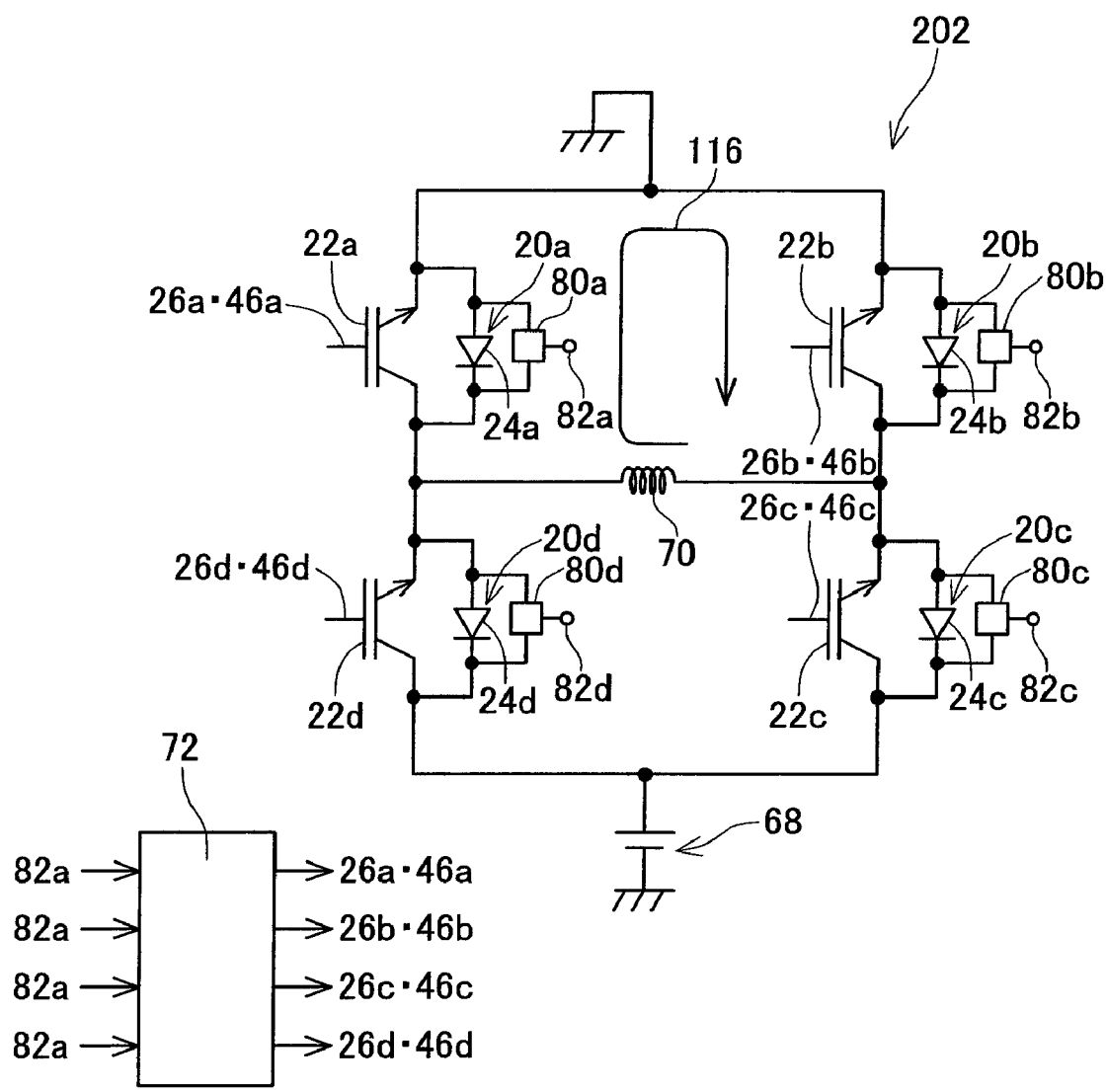
FIG. 7 schematically shows the structure of the power supply device 202.

Since the motor coil 70 includes a reactance component, when the IGBT element domain 22c of the reverse conducting semiconductor device 20c that had been on until then is switched to the off-state, as shown in FIG. 7, an electromotive force that enhances a return current 116 to flow in the same direction as the current 114 is generated in the motor coil 70. In the second period, the voltage H1 is being applied to the reverse conducting semiconductor device 20a through which the current 114 has been flowing, and as shown in FIG. 7, the current 114 flows to the lower potential side via the IGBT element domain 22a of the reverse conducting semiconductor device 20a. Thereafter, the current 114 flows to the motor coil 70 via the diode element domain 24b of the reverse conducting semiconductor device 20b. Due to the electromotive force generated in the motor coil 70, in the reverse conducting semiconductor device 20b, the voltage of the emitter electrode 32b becomes higher than that of the collector electrode 42b. As shown in the reverse conducting semiconductor device 20 of FIG. 2, the return current 116 flows in the diode element domain 24b of the reverse conducting semiconductor device 20b. In this case, the emitter electrode 32b becomes the anode, and the collector electrode 42b becomes the cathode.

In the driving method of the present embodiment, during the second period, the gate voltage applying circuit 72 applies a positive voltage (voltage H2) that is higher than the voltage of the emitter electrode 32b to the reverse conducting semiconductor device 20b through which the return current flows.

By applying the voltage H2 to the reverse conducting semiconductor device 20b, as shown in FIG. 5, in the body region 36b including the p-type impurities, in ranges that are facing the first trench gate electrodes 26b and the second trench gate electrodes 46b respectively, the inversion layers 60 of the n-type are formed. When the inversion layers 60 are formed in the body region 36b, a current path for flowing the electrons from the collector electrode 42b to the emitter electrode 32b is formed. Thereby, the injection efficiency of the holes injected into the drift region 38b can be decreased. Hence, as shown in FIG. 8, after the second period T2 has elapsed and at an early period during the first period T1, the reverse recovery current Ir (cf. FIG. 8) caused by the holes returning to the body region 36b from the drift region 38b is suppressed. The switching loss in the diode element domain 24b can be suppressed, and the switching loss caused in the power supply device 202 can be suppressed.

Upon returning again from the second period to the first period, the process proceeds to a third period indicated as T3 in FIG. 8 from the second period, and then from the third period, proceeds to the first period. Upon proceeding to the third period from the second period, the gate voltage applying circuit 72 switches the voltage to be applied to the reverse conducting semiconductor device 20b through which the return current flows from the voltage H2 to the voltage H3. The IGBT element domain 22d of the reverse conducting semiconductor device 20d is maintained in the off-state, and the IGBT element domain 22a of the reverse conducting semiconductor device 20a is maintained in the on-state. Due to this, the return current 116 still flows during the third period.

By applying the voltage H3 to the reverse conducting semiconductor device 20b, as shown in FIG. 5, in the body region 36b, a state in which the inversion layers 60 of the n-type are formed in the ranges facing the first trench gate electrodes 26b and the second trench gate electrodes 46b respectively is maintained. Further, the IGBT element domain 22b of the reverse conducting semiconductor device 20b enters the off-state. Due to this, upon shifting from the third period to the first period, the IGBT element domain 22b of the reverse conducting semiconductor device 20b is surely maintained in the off-state. Thus, the IGBT element domain 22c of the reverse conducting semiconductor device 20c is prevented from being turned on together with the IGBT element domain 22b of the reverse conducting semiconductor device 20b upon shifting from the third period to the first period and turning on the IGBT element domain 22c of the reverse conducting semiconductor device 20c. According to this, through the IGBT element domain 22b of the reverse conducting semiconductor device 20b and the IGBT element domain 22c of the reverse conducting semiconductor device 20c, an enormous penetrating current is made to flow from the positive power source of the DC power source 68 to the ground potential, and the reverse conducting semiconductor device 20 is prevented from being damaged.

In the driving method of the present embodiment, even in the third period, the state in which the inversion layers 60 of the n-type are formed in the ranges facing the first trench gate electrodes 26b and the second trench gate electrodes 46b respectively is maintained. Due to this, even in the third period, the injection efficiency of the holes injected into the drift region 38b can be lowered. After the third period T3 has elapsed and in the early period during the first period T1, the reverse recovery current Ir (cf. FIG. 8) caused by the holes returning to the body region 36b from the drift region 38b is suppressed. Thereby, the switching loss caused in the diode element domain 24b can be suppressed, and the switching loss caused in the power supply device 202 can be suppressed.

Upon shifting from the third period to the first period, the IGBT element domain 22c of the reverse conducting semiconductor device 20c that had been off is switched to the on-state. Further, the gate voltage applying circuit 72 detects a timing tw at which the voltage on the cathode side of the diode element domain 24c of the reverse conducting semiconductor device 20c becomes high compared to the voltage on the anode side thereof. The gate voltage applying circuit 72 switches the voltage to be applied to the reverse conducting semiconductor device 20b from the voltage H3 to the voltage Lo at this timing tw. The IGBT element domain 22d of the reverse conducting semiconductor device 20d is maintained in the off-state, and the IGBT element domain 22a of the reverse conducting semiconductor device 20a is maintained in the on-state.

In the driving method of the present embodiment, being delayed from the shifting from the third period to the first period, the voltage to be applied to the reverse conducting semiconductor device 20b is switched from the voltage 113 to the voltage Lo. Further, the timing tw at which the voltage H3 is switched to the voltage Lo is determined by a timing at which the voltage on the cathode side of the diode element domain 24c of the reverse conducting semiconductor device 20c becomes high compared to the voltage on the anode side thereof. That is, it is determined by a timing at which a voltage in the reversed direction is applied to the diode element domain 24c of the reverse conducting semiconductor device 20c and the reverse recovery current Ir flows therein, and the switching loss occurs due to the voltage in the reversed direction and the reverse recovery current Ir. According to the driving method of the present embodiment, the reverse recovery current Ir can be suppressed by keeping the application of the voltage H3 to the reverse conducting semiconductor device 20b until the timing at which the switching loss occurs, and thereby the switching loss caused in the power supply device 202 can be suppressed.

Specific embodiments of the present invention are described above, but these merely illustrate some examples and do not restrict the scope of the claims.

For example, in the semiconductor device 2, although the first gate voltage applying circuit 10 and the second gate voltage applying circuit 12 are described as separate circuits, they may be configured by a single gate voltage applying circuit. If the single gate voltage applying circuit is connected to both the first trench gate electrodes 26 and the second trench gate electrodes 46 independently and respectively, then the first trench gate electrodes 26 and the second trench gate electrodes 46 can be controlled independently.

The technical elements disclosed in the specification or the drawings may be utilized separately or in all types of combinations, and are not limited to the combinations set forth in the claims at the time of filing of the application. Furthermore, the technology illustrated in the present specification or the drawings may simultaneously achieve a plurality of objects, and has technological utility by achieving one of those objects.

The invention claimed is:

1. A semiconductor device comprising:
    a reverse conducting semiconductor device including an IGBT element domain and a diode element domain coexisting in a mutual semiconductor substrate, wherein
    in the IGBT element domain, a second conductive type body region, a first conductive type drift region, and a second conductive type collector region are laminated, a first conductive type emitter region is formed on a surface of the body region, and a first trench gate electrode penetrating the body region that separates the emitter region from the drift region is formed,
    in the diode element domain, a second conductive type body region, a first conductive type drift region and a first conductive type drift contact region are laminated, a first conductive type first body contact region and a second conductive type second body contact region are formed on a surface of the body region, and a second trench gate electrode penetrating the body region that separates the first body contact region from the drift region is formed;
    a first gate voltage applying circuit controlling a voltage applied to the first gate electrode; and
    a second gate voltage applying circuit controlling a voltage applied to the second gate electrode, wherein
    each of the first and second gate voltage applying circuits applies a first voltage to at least the first trench gate electrode in a case where the IGBT element domain is maintained in an on-state, and applies a second voltage to at least the second trench gate electrode in a case where return current flows in the diode element domain,
    when the first voltage is higher than that of the body region, then the second voltage is higher than that of the body region, and when the first voltage is lower than that of the body region, then the second voltage is lower than that of the body region, and
    the first and second gate voltage applying circuits are composed of one single gate voltage applying circuit.

2. The semiconductor device as in claim 1, wherein the first voltage is equal to the second voltage.

3. A method for driving a power supply device including at least two reverse conducting semiconductor devices, including an IGBT element domain and a diode element domain coexisting in a mutual semiconductor substrate, wherein,
    in the IGBT element domain, a second conductive type body region, a first conductive type drift region, and a second conductive type collector region are laminated, a first conductive type emitter region is formed on a surface of the body region, and a first trench gate electrode penetrating the body region that separates the emitter region from the drift region is formed,
    in the diode element domain, a second conductive type body region, a first conductive type drift region and a first conductive type drift contact region are laminated, a first conductive type first body contact region and a second conductive type second body contact region are formed on a surface of the body region, and a second trench gate electrode penetrating the body region that separates the first body contact region from the drift region is formed,
the method comprising:
    a first step of applying a first voltage to at least the first trench gate electrode of one of the two reverse conducting semiconductor devices in a case where the IGBT element domain of the other of the two reverse conducting semiconductor devices is switched to an off-state and an electric power is supplied by switching the IGBT element domain of the one reverse conducting semiconductor device to an on-state; and
    a second step of applying a second voltage to at least the second trench gate electrode of the other reverse conducting semiconductor device in a case where return current flows in the diode element domain of the other reverse conducting semiconductor device by switching the IGBT element domain of the one reverse conducting semiconductor device to the off-state,
    wherein
    the power supply device is driven by repeating the first step and the second step,
    when the first voltage is higher than that of the body region of the one reverse conducting semiconductor device, then the second voltage is higher than that of the body region of the other reverse conducting semiconductor device, and when the first voltage is lower than that of the body region of the one reverse conducting semiconductor device, then the second voltage is lower than that of the body region of the other reverse conducting semiconductor device, and
    the method further comprises a third step of maintaining the IGBT element domain of at least the other reverse conducting semiconductor device in the off-state for a predetermined time before the IGBT element domain of the one reverse conducting semiconductor device is switched back to the on-state from the off-state.

4. The method for driving a power supply device as in claim 3, wherein
    in the third step, a third voltage is applied to the second trench gate electrode of the other reverse conducting semiconductor device, and
    when the first voltage is higher than that of the body region of the one reverse conducting semiconductor device, then the third voltage is higher than that of the body region of the other reverse conducting semiconductor device, and when the first voltage is lower than that of the body region of the one reverse conducting semiconductor device, then the third voltage is lower than that of the body region of the other reverse conducting semiconductor device.

5. The method for driving a power supply device as in claim 4, wherein
    in a case where the first step is to be performed by switching the IGBT element domain of the one reverse conducting semiconductor device to the on-state from the off-state after the third step, a voltage of the diode element domain of the other reverse conducting semiconductor device is measured, and the third voltage is applied to at least the second trench gate electrode of the other reverse conducting semiconductor device until the voltage of the diode element domain of the other reverse conducting semiconductor device exceeds a threshold voltage that causes the return current of the diode element domain of the other reverse conducting semiconductor device.

* * * * *

UNITED STATES PATENT AND TRADEMARK OFFICE
CERTIFICATE OF CORRECTION

PATENT NO.       : 8,248,116 B2
APPLICATION NO.  : 12/867591
DATED            : August 21, 2012
INVENTOR(S)      : Akitaka Soeno et al.

Page 1 of 1

It is certified that error appears in the above-identified patent and that said Letters Patent is hereby corrected as shown below:

In the Cover Page:   Change "(22) PCT Filed:   Feb. 14, 2009"

to --(22) PCT Filed:   Feb. 02, 2009--.

| Column | Line | |
|---|---|---|
| 15 | 45 | Change "voltages 112" to --voltages H2--. |
| 15 | 48 | Change "voltage 112" to --voltage H2--. |
| 18 | 34 | Change "voltage 113" to --voltage H3--. |
| 19 | 47 | Before "reverse" insert --of the--. |

Signed and Sealed this
First Day of January, 2013

David J. Kappos
*Director of the United States Patent and Trademark Office*